(12) United States Patent
Jeong et al.

(10) Patent No.: US 11,361,878 B2
(45) Date of Patent: Jun. 14, 2022

(54) METHOD FOR MANUFACTURING INSULATING FILM AND SEMICONDUCTOR PACKAGE

(71) Applicant: LG CHEM, LTD., Seoul (KR)

(72) Inventors: Woo Jae Jeong, Daejeon (KR); You Jin Kyung, Daejeon (KR); Byung Ju Choi, Daejeon (KR); Bo Yun Choi, Daejeon (KR); Kwang Joo Lee, Daejeon (KR); Min Su Jeong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 365 days.

(21) Appl. No.: 16/326,073

(22) PCT Filed: Jul. 2, 2018

(86) PCT No.: PCT/KR2018/007478
§ 371 (c)(1),
(2) Date: Feb. 15, 2019

(87) PCT Pub. No.: WO2019/013482
PCT Pub. Date: Jan. 17, 2019

(65) Prior Publication Data
US 2019/0189304 A1    Jun. 20, 2019

(30) Foreign Application Priority Data

Jul. 14, 2017   (KR) ........................ 10-2017-0089707

(51) Int. Cl.
*H01B 3/32*     (2006.01)
*H01L 23/31*    (2006.01)
(Continued)

(52) U.S. Cl.
CPC ................ *H01B 3/32* (2013.01); *G03F 7/40* (2013.01); *H01B 3/30* (2013.01); *H01L 21/561* (2013.01);
(Continued)

(58) Field of Classification Search
None
See application file for complete search history.

(56) References Cited

U.S. PATENT DOCUMENTS

2003/0227095 A1   12/2003   Fujisawa et al.
2011/0079913 A1    4/2011   Chino
(Continued)

FOREIGN PATENT DOCUMENTS

JP   2003-264370 A    9/2003
JP   2010-231050 A   10/2010
(Continued)

OTHER PUBLICATIONS

Extended European Search Report issued for European Patent Application No. 18830357.2 dated Aug. 5, 2019, 7 pages.

*Primary Examiner* — Kathleen Duda
(74) *Attorney, Agent, or Firm* — Rothwell, Figg, Ernst & Manbeck, P.C.

(57) ABSTRACT

The present invention relates to a method for manufacturing an insulating layer which can minimize the degree of warpage caused by polymer shrinkage at the time of curing and secure the stability of a semiconductor chip located therein, and a method for manufacturing a semiconductor package using an insulating layer obtained from the manufacturing method of the insulating layer.

17 Claims, 2 Drawing Sheets

(51) Int. Cl.
  *H01L 23/532* (2006.01)
  *H01L 23/00* (2006.01)
  *H01L 21/56* (2006.01)
  *H01B 3/30* (2006.01)
  *G03F 7/40* (2006.01)
  *G03F 7/30* (2006.01)

(52) U.S. Cl.
  CPC ............ *H01L 23/31* (2013.01); *H01L 23/532* (2013.01); *H01L 23/5329* (2013.01); *H01L 24/07* (2013.01); *G03F 7/30* (2013.01); *H01L 21/568* (2013.01); *H01L 2224/04105* (2013.01); *H01L 2224/96* (2013.01)

(56) References Cited

U.S. PATENT DOCUMENTS

| | | |
|---|---|---|
| 2011/0272800 A1 | 11/2011 | Chino |
| 2015/0325431 A1 | 11/2015 | Aoki et al. |
| 2016/0027695 A1 | 1/2016 | Ikemoto et al. |
| 2016/0358833 A1* | 12/2016 | Soga ..................... H01L 21/565 |
| 2017/0045817 A1 | 2/2017 | Nagoshi et al. |
| 2019/0056658 A1* | 2/2019 | Choi ........................ C08K 7/00 |
| 2019/0148175 A1* | 5/2019 | Hazeyama ............... C09J 7/241 |
| | | 438/113 |

FOREIGN PATENT DOCUMENTS

| | | |
|---|---|---|
| JP | 2011-238767 A | 11/2011 |
| JP | 2014-078622 A | 5/2014 |
| JP | 2016-213321 A | 12/2016 |
| KR | 10-2017-0081195 A | 7/2017 |
| TW | 201604655 A | 2/2016 |
| TW | 201606970 A | 2/2016 |
| WO | 2011/078319 A1 | 6/2011 |
| WO | 2017038598 A1 | 3/2017 |
| WO | 2017115606 A1 | 7/2017 |

* cited by examiner

[FIG. 1]
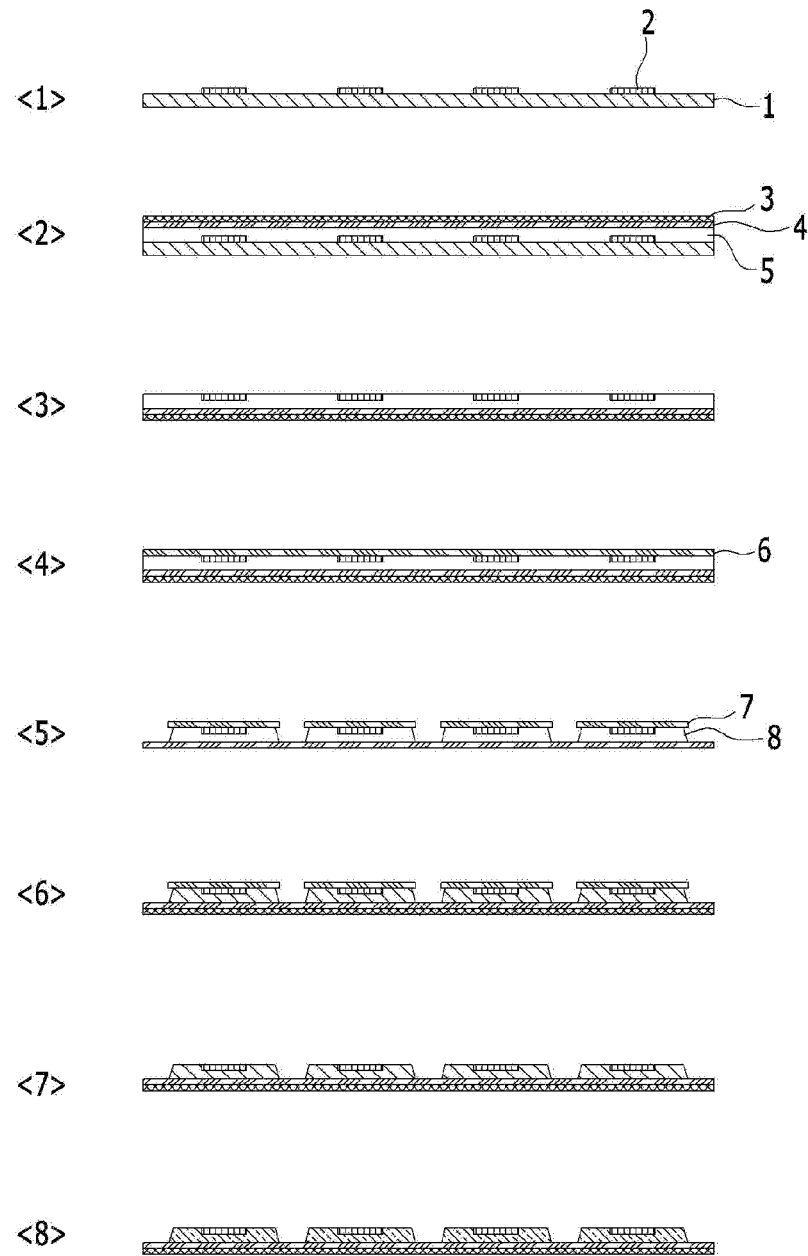

[FIG. 2]
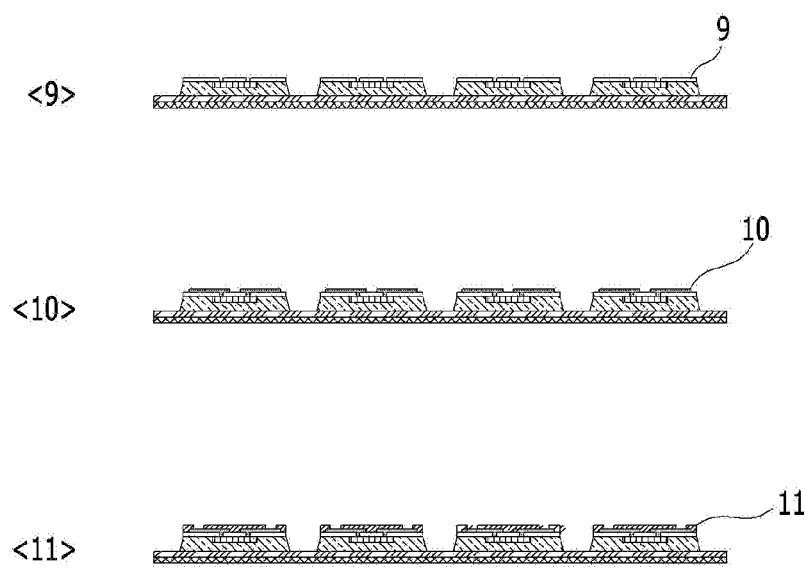

METHOD FOR MANUFACTURING INSULATING FILM AND SEMICONDUCTOR PACKAGE

CROSS-REFERENCE TO RELATED APPLICATION(S)

This application is a 35 U.S.C. § 371 National Phase Entry Application from PCT/KR2018/007478, filed on Jul. 2, 2018, and designating the United States, which claims priority to and the benefits of Korean Patent Application No. 10-2017-0089707 filed with the Korean Intellectual Property Office on Jul. 14, 2017, the disclosures of which are incorporated herein by reference in their entirety.

TECHNICAL FIELD

Background Art

Recent electronic devices are increasingly miniaturized, weight-lightened, and highly functionalized. In order to satisfy the demand of such recent electronic device fields, it has become necessary to mount the semiconductor element inside the electronic device. In recent years, such a trend has been realized as semiconductor elements are miniaturized and the integration degree thereof is improved.

In order for semiconductor elements to receive an electric signal in an electronic device, electric wiring is essential, and insulation for semiconductor elements and electric wiring is required for stable electrical signal transmission.

In this way, a build-up semiconductor packaging process is used for the wiring connection of the semiconductor element and also for the formation of the insulating layer therebetween. Such a semiconductor packaging process has advantages in that it can improve the integration of functional elements, allowing electronic products to have slimness, lightness, and high performance, to achieve structural integration of electric functions, and to be produced in a reduced assembly time period and at a low cost.

In particular, in order to form the insulating layer, a method of coating a polymer resin composition and heat-curing or photo-curing it is used. However, as a curable resin is used for the semiconductor package in this way, warpage occurs in a semiconductor package due to shrinkage of the polymer resin in the curing process, and thus it is difficult to be supported on the ground surface. In addition, when a plurality of semiconductor elements are embedded in a polymer resin, there is a limitation in that, while the embedded semiconductor chip moves due to warpage caused by shrinkage of the polymer resin in the curing process, the stability and the insulation property of the internal structure are greatly reduced.

In order to solve the problems caused by such warpage, a method of correcting the initial position of the semiconductor chip by applying a physical force in the direction opposite to the direction of warpage during the process or predicting movement of the semiconductor chip has been proposed. However, since the degree of force or the position of the semiconductor chip must be corrected each time the product type changes, there is a problem that reproducibility and efficiency of the process are greatly reduced.

In addition, a method of strongly fixing a semiconductor chip to a package support to prevent movement of a semiconductor chip has been proposed, but there is a limitation in that the stability is reduced, for example, the semiconductor chip is broken due to a strong stress generated at the time of shrinkage of the polymer resin.

DETAILED DESCRIPTION OF THE INVENTION

Technical Problem

It is an object of the present invention to provide a method for manufacturing an insulating layer which can minimize the degree of warpage caused by polymer shrinkage at the time of curing and secure the stability of a semiconductor chip located therein.

It is another object of the present invention to provide a method for manufacturing a semiconductor package using an insulating layer obtained from the manufacturing method of the insulating layer.

Technical Solution

The present disclosure provides a method for manufacturing an insulating layer comprising: sealing at least two or more semiconductor elements between a photosensitive resin layer and a polymer resin layer, wherein the polymer resin layer is formed on a substrate and contains an alkali-soluble resin and a heat-curable binder; exposing to light and alkali-developing the photosensitive resin layer to form a photosensitive resin block, alkali-developing an exposed polymer resin layer by the photosensitive resin block to form a polymer resin block; and curing the polymer resin block to form the insulating layer, wherein in the alkali developing step, at least one semiconductor element is sealed between the photosensitive resin block and the polymer resin block which are in contact with each other.

The present disclosure also provides a method for manufacturing a semiconductor package comprising steps of: forming an insulating pattern layer on the insulating layer manufactured by the method for manufacturing the insulating layer; and forming a metal pattern layer on the insulating pattern layer.

Hereinafter, a method for manufacturing an insulating layer and a method for manufacturing a semiconductor package according to a specific embodiment of the present invention will be described in more detail.

In the present specification, examples of the halogen group are fluorine, chlorine, bromine, and iodine.

In the present specification, the alkyl group may be a straight chain or a branched chain, and the number of carbon atoms thereof is not particularly limited, but is preferably 1 to 40. According to one embodiment, the alkyl group has 1 to 20 carbon atoms. According to another embodiment, the alkyl group has 1 to 10 carbon atoms. According to still another embodiment, the alkyl group has 1 to 6 carbon atoms. Specific examples of the alkyl group include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethylpropyl, isohexyl, 2-methylpentyl, 4-methylhexyl, 5-methylhexyl, and the like, but are not limited thereto.

In the present specification, the aryl group is not particularly limited, but preferably has 6 to 60 carbon atoms, and may be a monocyclic aryl group or a polycyclic aryl group.

According to one embodiment, the aryl group has 6 to 30 carbon atoms. According to one embodiment, the aryl group has 6 to 20 carbon atoms. The aryl group may be a phenyl group, a biphenyl group, a terphenyl group, or the like as the monocyclic aryl group, but is not limited thereto. Examples of the polycyclic aryl group include a naphthyl group, an anthracenyl group, a phenanthryl group, a pyrenyl group, a perylenyl group, a chrycenyl group, a fluorenyl group, and the like, but are not limited thereto.

According to an embodiment of the present invention, a method for manufacturing an insulating layer may be provided, comprising the steps of: sealing at least two or more semiconductor elements between a photosensitive resin layer and a polymer resin layer containing an alkali-soluble resin and a heat-curable binder formed on a substrate; exposing to light and alkali-developing the photosensitive resin layer to form a photosensitive resin block, alkali-developing an opened polymer resin layer to form a polymer resin block; and curing the polymer resin block, wherein in the alkali developing step, at least one semiconductor element is sealed between the photosensitive resin block and the polymer resin block which are in contact with each other.

The present inventors found that when using the method of manufacturing an insulating layer according to one embodiment, a polymer resin layer sealing a plurality of semiconductor elements is separated into a polymer resin block through chemical etching with an alkaline aqueous solution and the semiconductor elements are each independently sealed with the respective polymer resin blocks, thereby enabling the manufacture of a miniaturized semiconductor package, and simultaneously the occurrence of warpage at the time of curing can be minimized due to a decrease in the maximum longitudinal cross-sectional length of the polymer resin block, thereby realizing a stable semiconductor package. The present invention has been completed on the basis of such findings.

In the case of the polymer resin layer, the occurrence of warpage is reduced in the intermediate portion with reference to the longitudinal cross-sectional diameter, and the occurrence of warpage is relatively greatly increased at both end portions. In the present invention, by forming a polymer resin block having a maximum longitudinal cross-sectional diameter that is relatively smaller than the maximum cross-sectional length of the polymer resin layer, the occurrence of warpage at the time of curing can be remarkably reduced.

Further, as at least one semiconductor element is sealed independently for each polymer resin block, the movement of the semiconductor element can be blocked and so the stability of the semiconductor package can be secured.

In particular, the polymer resin used for forming the polymer resin block is blocked by chemical etching. Therefore, the physical damage of the insulating layer or the lower support can be minimized, the surface quality of the polymer resin block can be improved, and the thickness of a fine micro-level insulating layer can be easily adjusted to a desired range. Further, the insulating layer and the semiconductor package can be manufactured easily in a short time, and thus the efficiency of a process can be improved.

Hereinafter, each step of the method for manufacturing the insulating layer of the one embodiment will be described in more detail.

First Step: Sealing at Least Two or More Semiconductor Elements Between a Photosensitive Resin Layer and a Polymer Resin Layer, Wherein the Polymer Resin Layer is Formed on a Substrate and Contains an Alkali-Soluble Resin and a Heat-Curable Binder As the at least two or more semiconductor elements are sealed between a photosensitive resin layer and a polymer resin layer containing an alkali-soluble resin and a heat-curable binder formed on a substrate, the remaining surface excluding a surface area in contact with the photosensitive resin layer among the entire surface area of the semiconductor element comes into contact with the polymer resin layer, so that all the surfaces of the semiconductor element may not be exposed to the air. Thereby, the semiconductor element can be stably protected by being surrounded by the polymer resin layer and the photosensitive resin layer, and it is possible to block direct contact between the semiconductor elements or between the semiconductor element and other semiconductor package components, for example, electric wiring or a lower substrate.

Examples of the substrate include circuit boards, copper-clad laminates, sheets, multilayer printed wiring boards, and semiconductor materials such as silicon wafers.

The polymer resin layer means a film formed by drying a polymer resin composition containing an alkali-soluble resin and a heat-curable binder. The polymer resin layer may contain 1 to 150 parts by weight, or 10 to 100 parts by weight, or 20 to 50 parts by weight of a heat-curable binder with respect to 100 parts by weight of the alkali-soluble resin. If the content of the heat-curable binder is too high, the developing properties of the polymer resin layer are deteriorated and the strength may be lowered. On the other hand, if the content of the heat-curable binder is too low, not only is the polymer resin layer excessively developed, but also uniformity during the coating process may be lowered.

The heat-curable binder may include a heat-curable functional group, at least one functional group selected from the group consisting of an oxetanyl group, a cyclic ether group, a cyclic thioether group, a cyanide group, a maleimide group, and a benzoxanine group, and an epoxy group. That is, the heat-curable binder necessarily includes an epoxy group. In addition to an epoxy group, it may include an oxetanyl group, a cyclic ether group, a cyclic thioether group, a cyanide group, a maleimide group, a benzoxanine group, or a combination of two or more thereof. Such heat-curable binder can form a crosslink bond with an alkali-soluble resin or the like by heat-curing to ensure the heat resistance or mechanical properties of the insulating layer.

More specifically, as the heat-curable binder, a polyfunctional resin compound containing two or more of the above-mentioned functional groups in the molecule can be used.

The polyfunctional resin compound may include a resin containing two or more cyclic ether groups and/or cyclic thioether groups (hereinafter referred to as cyclic(thio)ether groups) in a molecule.

The heat-curable binder containing two or more cyclic (thio)ether groups in a molecule may include a compound having two or more of any one kind or two kinds selected among a 3, 4, and 5-membered cyclic ether groups or a cyclic thioether group in a molecule.

Examples of the compound having two or more cyclic thioether groups in the molecule include the bisphenol A type episulfide resin YL7000 manufactured by Japan Epoxy Resin Co. Ltd., and the like.

In addition, the polyfunctional resin compound may include a polyfunctional epoxy compound containing at least two epoxy groups in a molecule, a polyfunctional oxetane compound having at least two oxetanyl groups in a molecule, an episulfide resin containing two or more thioether groups in a molecule, a polyfunctional cyanate ester compound containing at least two or more cyanide groups in a molecule, a polyfunctional benzoxazine compound containing at least two or more benzoxazine groups in a molecule, and the like.

Specific examples of the polyfunctional epoxy compound include, for example, a bisphenol A type epoxy resin, a hydrogenated bisphenol A type epoxy resin, a brominated bisphenol A type epoxy resin, a bisphenol F type epoxy resin, a bisphenol S type epoxy resin, a novolac type epoxy resin, a phenol novolac type epoxy resin, a cresol novolac type epoxy resin, an N-glycidyl type epoxy resin, a bisphenol A type novolac epoxy resin, a bixylenol type epoxy resin, a biphenol type epoxy resin, a chelate epoxy resin, a glyoxal epoxy resin, an amino group-containing epoxy resin, a rubber-modified epoxy resin, a dicyclopentadiene phenolic epoxy resin, a diglycidyl phthalate resin, a heterocyclic epoxy resin, a tetraglycidyl xylenoyl ethane resin, a silicone-modified epoxy resin, ε-caprolactone-modified epoxy resin, and the like.

Further, in order to impart flame retardancy, a compound in which atoms such as phosphorus are introduced into its structure may be used. These epoxy resins may improve properties such as adhesion of a cured coating film, solder heat resistance, electroless plating resistance, and the like, by heat-curing.

Examples of the polyfunctional oxetane compound may include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and oligomers or copolymers thereof, and may additionally include etherified products of oxetane alcohol with a hydroxy group-containing resin such as a novolac resin, poly(p-hydroxy styrene), cardo-type bisphenols, calixarenes, calixresorcinarenes, silsesquioxane, and the like. In addition, copolymers of an unsaturated monomer having an oxetane ring with alkyl(meth)acrylate may be included.

Examples of the polyfunctional cyanate ester compound may include a bisphenol A type cyanate ester resin, a bisphenol E type cyanate ester resin, a bisphenol F type cyanate ester resin, a bisphenol S type cyanate ester resin, a bisphenol M type cyanate ester resin, a novolac type cyanate ester resin, a phenol novolac type cyanate ester resin, a cresol novolac type cyanate ester resin, a bisphenol A type novolac cyanate ester resin, a biphenol type cyanate ester resin, an oligomer or copolymer thereof, and the like.

Examples of the polyfunctional maleimide compound may include 4,4'-diphenylmethane bismaleimide, phenylmethane bismaleimide, m-phenylmethane bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, and the like.

Examples of the polyfunctional benzoxazine compound may include a bisphenol A type benzoxazine resin, a bisphenol F type benzoxazine resin, a phenolphthalein type benzoxazine resin, a thiodiphenol type benzoxazine resin, a dicyclopentadiene type benzoxazine resin, a 3,3'-(methylene-1,4-diphenylene)bis(3,4-dihydro-2H-3,4-dihydro-2H-1,3-benzoxazine)resin, and the like.

More specific examples of the polyfunctional resin compound may include YDCN-500-80P (Kukdo Chemical Co., Ltd.), a phenol novolac type cyanide ester resin PT-30S (LONZA Ltd.), phenylmethane type maleimide resin BMI-2300 (Daiwa Kasei Kogyo Co., Ltd.), P-d type benzoxazine resin (Shikoku Chemicals Corporation), and the like.

Meanwhile, the alkali-soluble resin may include at least one, or two or more, acidic functional group; and at least one cyclic imide functional group substituted with an amino group. Examples of the acidic functional group are not particularly limited, but for example, it may include a carboxy group or a phenol group. When the alkali-soluble resin includes at least two acidic functional groups, the polymer resin layer exhibits higher alkaline developing properties and thus the developing speed of the polymer resin layer can be adjusted.

The cyclic imide functional group substituted with an amino group contains an amino group and a cyclic imide group in the structure of the functional group, and may include at least two or more. When the alkali-soluble resin includes at least two or more cyclic imide functional groups substituted with the amino group, the alkali-soluble resin has a structure in which a large number of active hydrogen atoms contained in the amino group are present. Therefore, while increasing the reactivity with the heat-curable binder during heat-curing, the curing density is increased, thereby increasing the heat resistance reliability and mechanical properties.

In addition, as a large number of the cyclic imide functional groups are present in the alkali-soluble resin, the polarity is increased by the carbonyl group and the tertiary amine group contained in the cyclic imide functional group, so that the interfacial adhesion of the alkali-soluble resin can be increased. Thereby, the polymer resin layer containing the alkali-soluble resin can have increased interfacial adhesion with the metal layer laminated on the upper side. Specifically, it can have higher adhesion than the interfacial adhesion between the carrier film and the metal layer laminated on the metal layer. Therefore, the physical release between the carrier film and the metal layer can be made possible, as will be described later.

More specifically, the cyclic imide functional group substituted with an amino group may include a functional group represented by the following Chemical Formula 1.

[Chemical Formula 1]

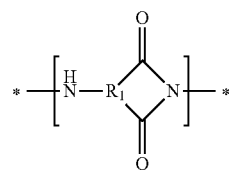

In Chemical Formula 1, $R_1$ is an alkylene group or an alkenyl group having 1 to 10 carbon atoms, 1 to 5 carbon atoms, or 1 to 3 carbon atoms forming an imide ring, and "*" means a bonding point. The alkylene group is a bivalent functional group derived from an alkane, for example, a linear, branched, or cyclic group, and includes a methylene group, an ethylene group, a propylene group, an isobutylene group, a sec-butylene group, a tert-butylene group, a pentylene group, a hexylene group, and the like. One or more hydrogen atoms contained in the alkylene group can be substituted with another substituent, and examples of the other substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide group, a carbonyl group, a hydroxy group, a sulfonyl group, a carbamate group, an alkoxy group having 1 to 10 carbon atoms, and the like.

The term "substituted" as used herein means that another functional group is bonded instead of a hydrogen atom in the compound, and the position to be substituted is not limited as long as it is a position at which a hydrogen atom is substituted, that is, a position at which the substituent is substitutable. When two or more substituents are substituted, the two or more substituents may be the same as or different from each other.

The alkenyl group means that the above-mentioned alkylene group contains at least one carbon-carbon double bond at the middle or terminal thereof, and examples thereof include ethylene, propylene, butylene, hexylene, acetylene, and the like. One or more hydrogen atoms in the alkenyl group may be substituted with a substituent in the same manner as in the alkylene group.

Preferably, the cyclic imide functional group substituted with the amino group may be a functional group represented by the following Chemical Formula 2.

[Chemical Formula 2]

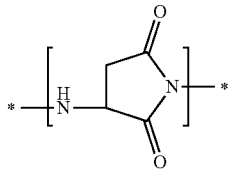

In Chemical Formula 2, "*" means a bonding point.

As described above, the alkali-soluble resin includes a cyclic imide functional group substituted with an amino group together with an acidic functional group. Specifically, an acidic functional group may be bonded to at least one terminal of the cyclic imide functional group substituted with an amino group. At this time, the cyclic imide functional group substituted with an amino group and the acidic functional group may be bonded via a substituted or unsubstituted alkylene group or a substituted or unsubstituted arylene group. For example, an acidic functional group may be bonded via a substituted or unsubstituted alkylene group or a substituted or unsubstituted arylene group to the terminal of the amino group contained in the imide functional group substituted with an amino group. An acidic functional group may be bonded, via a substituted or unsubstituted alkylene group or a substituted or unsubstituted arylene group, to the terminal of the cyclic imide functional group contained in the imide functional group substituted with an amino group.

More specifically, the terminal of the amino group contained in the cyclic imide functional group substituted with an amino group means a nitrogen atom contained in the amino group in Chemical Formula 1, and the terminal of the imide functional group contained in the cyclic imide functional group substituted with an amino group means a nitrogen atom contained in a cyclic imide functional group in Chemical Formula 1.

The alkylene group is a bivalent functional group derived from an alkane, for example, a linear, branched, or cyclic group, and includes a methylene group, an ethylene group, a propylene group, an isobutylene group, a sec-butylene group, a tert-butylene group, a pentylene group, a hexylene group, and the like. One or more hydrogen atoms contained in the alkylene group can be substituted with another substituent, and examples of the substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide group, a carbonyl group, a hydroxy group, a sulfonyl group, a carbamate group, an alkoxy group having 1 to 10 carbon atoms, and the like.

The arylene group means a divalent functional group derived from an arene, for example, a cyclic group, and may include a phenyl group, a naphthyl group, or the like. One or more hydrogen atoms contained in the arylene group may be substituted with another substituent. Examples of the substituent include an alkyl group having 1 to 10 carbon atoms, an alkenyl group having 2 to 10 carbon atoms, an alkynyl group having 2 to 10 carbon atoms, an aryl group having 6 to 12 carbon atoms, a heteroaryl group having 2 to 12 carbon atoms, an arylalkyl group having 6 to 12 carbon atoms, a halogen atom, a cyano group, an amino group, an amidino group, a nitro group, an amide group, a carbonyl group, a hydroxy group, a sulfonyl group, a carbamate group, an alkoxy group having 1 to 10 carbon atoms, and the like.

Examples of the method for producing the alkali-soluble resin are not particularly limited, but for example, the alkali-soluble resin may be produced through reaction of a cyclic unsaturated imide compound and an amine compound. In this case, at least one of the cyclic unsaturated imide compound and the amine compound may contain an acidic functional group substituted at its terminal. That is, an acidic functional group may be substituted at the terminal of the cyclic unsaturated imide compound, the amine compound, or both of these two compounds. Details of the acid functional group are as described above.

The cyclic imide compound is a compound containing the above-mentioned cyclic imide functional group, and the cyclic unsaturated imide compound means a compound containing at least one unsaturated bond, that is, a double bond or a triple bond, in the cyclic imide compound.

The alkali-soluble resin can be produced through a reaction of an amino group contained in the amine compound with a double bond or a triple bond contained in the cyclic unsaturated imide compound.

Examples of the weight ratio for reacting the cyclic unsaturated imide compound and the amine compound are not particularly limited, but for example, the amine compound can be reacted by mixing in an amount of 10 to 80 parts by weight, or 30 to 60 parts by weight, based on 100 parts by weight of the cyclic unsaturated imide compound.

Examples of the cyclic unsaturated imide compound include N-substituted maleimide compounds. The term "N-substituted" means that a functional group instead of a hydrogen atom is bonded to a nitrogen atom contained in the maleimide compound, and the N-substituted maleimide compound may be classified into a monofunctional N-substituted maleimide compound and a polyfunctional N-substituted maleimide compound, depending on the number of N-substituted maleimide compounds.

The monofunctional N-substituted maleimide compound is a compound in which a nitrogen atom contained in one maleimide compound is substituted with a functional group, and the polyfunctional N-substituted maleimide compound is a compound in which a nitrogen atom contained in each of two or more maleimide compounds is bonded via a functional group.

In the monofunctional N-substituted maleimide compound, the functional group substituted on the nitrogen atom contained in the maleimide compound may include, but is not limited to, various known aliphatic, alicyclic, or aromatic functional groups, and the functional group substituted on the nitrogen atom may include a functional group in which an aliphatic, alicyclic or aromatic functional group is substituted with an acidic functional group. Details of the acid functional group are as described above.

Specific examples of the monofunctional N-substituted maleimide compound include o-methylphenyl maleimide, p-hydroxyphenyl maleimide, p-carboxyphenyl maleimide, dodecyl maleimide, or the like.

In the polyfunctional N-substituted maleimide compound, the functional group mediating the nitrogen-nitrogen bond contained in each of the two or more maleimide compounds may include, but is not limited to, various known aliphatic, alicyclic, or aromatic functional groups. In a specific example, a 4,4'-diphenylmethane functional group and the like can be used. The functional group substituted on the nitrogen atom may include a functional group in which an aliphatic, alicyclic, or aromatic functional group is substituted with an acidic functional group. Details of the acidic functional group are as described above.

Specific examples of the polyfunctional N-substituted maleimide compound include 4,4'-diphenylmethane bismaleimide (BMI-1000, BMI-1100, etc., available from Daiwakasei Industry Co., Ltd.), phenylmethane bismaleimide, m-phenylene methane bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, and the like.

The amine compound may be a primary amine compound containing at least one amino group (—NH$_2$) in the molecular structure. More preferably, a carboxylic acid compound substituted with an amino group, a polyfunctional amine compound containing two or more amino groups, or a mixture thereof can be used.

In the carboxylic acid compound substituted with an amino group, the carboxylic acid compound is a compound containing a carboxylic acid (—COOH) functional group in the molecule, and it may include all of aliphatic, alicyclic, or aromatic carboxylic acids depending on the kind of hydrocarbon bonded to the carboxylic acid functional group. As a large number of carboxylic acid functional groups, which are acid functional groups, are contained in the alkali-soluble resin through the carboxylic acid compound substituted with the amino group, the developing property of the alkali-soluble resin can be improved.

The term "substituted" means that another functional group is bonded instead of a hydrogen atom in the compound, and the position at which the amino group is substituted in the carboxylic acid compound is not limited as long as it is a position where a hydrogen atom may be substituted. The number of amino groups to be substituted can be 1 or more.

Specific examples of the carboxylic acid compound substituted with an amino group include 20 kinds of α-amino acid, 4-aminobutanoic acid, 5-aminopentanoic acid, 6-aminohexanoic acid, 7-amino heptanoic acid, 8-aminooctanoic acid, 4-aminobenzoic acid, 4-aminophenylacetic acid, 4-aminocyclohexane carboxylic acid, and the like, which are known as raw materials of proteins.

Further, the polyfunctional amine compound containing two or more amino groups may be a compound containing two or more amino groups (—NH$_2$) in the molecule, and it may include all of aliphatic, alicyclic, or aromatic polyfunctional amines depending on the type of hydrocarbon bonded with the amino group. The flexibility, toughness, adhesion of copper foil, etc. of the alkali-soluble resin can be improved through the polyfunctional amine compound containing two or more amino groups.

Specific examples of the polyfunctional amine compound containing two or more amino groups include 1,3-cyclohexanediamine, 1,4-cyclohexanediamine, 1,3-bis(aminomethyl)-cyclohexane, 1,4-bis(aminomethyl)-cyclohexane, bis(aminomethyl)-norbornene, octahydro-4,7-methanoindene-1 (2), 5(6)-dimethanamine, 4,4'-methylenebis(cyclohexylamine), 4,4'-methylenebis(2-methylcyclohexylamine), isophoronediamine, 1,3-phenylenediamine, 1,4-phenylenediamine, 2,5-dimethyl-1,4-phenylenediamine, 2,3,5,6-tetramethyl-1,4-phenylenediamine, 2,4,5,6-tetrafluoro-1,3-phenylenediamine, 2,3,5,6-tetrafluoro-1,4-phenylenediamine, 4,6-diaminoresorcinol, 2,5-diamino-1,4-benzenedithiol, 3-aminobenzylamine, 4-aminobenzylamine, m-xylenediamine, p-xylenediamine, 1,5-diaminonaphthalene, 2,7-diaminofluorene, 2,6-diaminoanthraquinone, m-tolidine, o-tolidine, 3,3',5,5'-tetramethylbenzidine (TMB), o-dianisidine, 4,4'-methylenebis(2-chloroaniline), 3,3'-diaminobenzidine, 2,2'-bis(trifluoromethyl)-benzidine, 4,4'-diaminoocta fluorobiphenyl, 4,4'-diamino-p-terphenyl, 3,3'-diaminodiphenylmethane, 3,4'-diaminodiphenylmethane, 4,4'-diaminodiphenylmethane, 4,4'-diamino-3,3'-dimethyldiphenylmethane, 4,4'-methylenebis(2-ethyl-6-methylaniline), 4,4'-methylenebis(2,6-diethylaniline), 3,3'-diaminobenzophenone, 4,4'-diaminobenzophenone, 4,4'-ethylenedianiline, 4,4'-diamino-2,2'-dimethylbibenzyl, 2,2'-bis(3-amino-4-hydroxyphenyl)propane, 2,2'-bis(3-aminophenyl)-hexafluoropropane, 2,2'-bis(3-aminophenyl)-hexafluoropropane, 2,2'-bis(3-amino-4-methylphenyl)-hexafluoropropane, 2,2'-bis(3-amino-4-hydroxyphenyl)-hexafluoropropane, α,α'-bis(4-aminophenyl)-1,4-diisopropylbenzene, 1,3-bis-[2-(4-aminophenyl)-2-propyl]benzene, 1,1'-bis(4-aminophenyl)-cyclohexane, 9,9'-bis(4-aminophenyl)-fluorene, 9,9'-bis(4-amino-3-chlorophenyl)fluorene, 9,9'-bis(4-amino-3-fluorophenyl)fluorene, 9,9'-bis(4-amino-3-methylphenyl)fluorene, 3,4'-diaminodiphenyl ether, 4,4'-diaminodiphenyl ether, 1,3-bis(3-aminophenoxy)-benzene, 1,3-bis(4-aminophenoxy)-benzene, 1,4-bis(4-aminophenoxy)-benzene, 1,4-bis(4-amino-2-trifluoromethylphenoxy)-benzene, 4,4'-bis(4-aminophenoxy)-biphenyl, 2,2'-bis-[4-(4-aminophenoxy)-phenyl]propane, 2,2'-bis-[4-(4-aminophenoxy)-phenyl]hexafluoropropane, bis(2-aminophenyl)sulfide, bis(4-aminophenyl) sulfide, bis(3-aminophenyl)sulfone, bis(4-aminophenyl)sulfone, bis(3-amino-4-hydroxy)sulfone, bis[4-(3-aminophenoxy)-phenyl]sulfone, bis-[4-(4-aminophenoxy)-phenyl]sulfone, o-tolidine sulfone, 3,6-diaminocarbazole, 1,3,5-tris(4-aminophenyl)-benzene, 1,3-bis(3-aminopropyl)-tetramethyldisiloxane, 4,4'-diaminobenzanilide, 2-(3-aminophenyl)-5-aminobenzimidazole, 2-(4-aminophenyl)-5-aminobenzoxazole, 1-(4-aminophenyl)-2,3-dihydro-1,3,3-trimethyl-1H-inden-5-amine, 4,6-diaminoresorcinol, 2,3,5,6-pyridine tetraamine, polyfunctional amines including a siloxane structure of Shin-Etsu Silicone (PAM-E, KF-8010, X-22-161A, X-22-161B, KF-8012, KF-8008, X-22-1660B-3, X-22-9409), polyfunctional amines including the siloxane structure of Dow Corning (Dow Corning 3055), polyfunctional amines including polyether structures (Huntsman, BASF), and the like.

Further, the alkali-soluble resin may include at least one repeating unit represented by the following Chemical Formula 3 and at least one repeating unit represented by the following Chemical Formula 4.

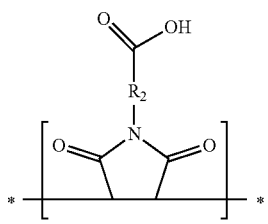

[Chemical Formula 3]

In Chemical Formula 3, $R_2$ is a direct bond, an alkylene group having 1 to 20 carbon atoms, an alkenyl group having 1 to 20 carbon atoms, or an arylene group having 6 to 20 carbon atoms, and "*" means a bonding point,

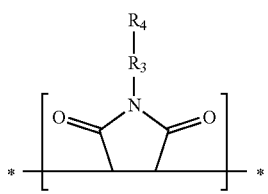

[Chemical Formula 4]

in Chemical Formula 4, $R_3$ is a direct bond, an alkylene group having 1 to 20 carbon atoms, an alkenyl group having 1 to 20 carbon atoms, or an arylene group having 6 to 20 carbon atoms, $R_4$ is —H, —OH, —$NR_5R_6$, a halogen, or an alkyl group having 1 to 20 carbon atoms, $R_5$ and $R_6$ are each independently be hydrogen, an alkyl group having 1 to 20 carbon atoms, or an aryl group having 6 to 20 carbon atoms, and "*" means a bonding point.

Preferably, in Chemical Formula 3, $R_2$ may be phenylene, and in Chemical Formula 4, $R_3$ may be phenylene and $R_4$ may be —OH.

Meanwhile, the alkali-soluble resin may further include a vinyl-based repeating unit in addition to the repeating unit represented by Chemical Formula 3 and the repeating unit represented by Chemical Formula 4. The vinyl-based repeating unit is a repeating unit contained in a homopolymer of a vinyl-based monomer containing at least one or more vinyl groups in the molecule, and examples of the vinyl-based monomer are not particularly limited, and for example, include ethylene, propylene, isobutylene, butadiene, styrene, acrylic acid, methacrylic acid, maleic anhydride, maleimide, or the like.

The alkali-soluble resin containing at least one repeating unit represented by Chemical Formula 3 and at least one repeating unit represented by Chemical Formula 4 can be produced by the reaction of a polymer containing a repeating unit represented by the following Chemical Formula 5, an amine represented by the following Chemical Formula 6, and an amine represented by the following Chemical Formula 7.

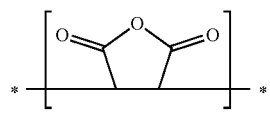

[Chemical Formula 5]

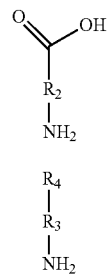

[Chemical Formula 6]

[Chemical Formula 7]

In Chemical Formulas 5 to 7, $R_2$ to $R_4$ are the same as those described above in Chemical Formulas 3 and 4, and "*" means a bonding point.

Specific examples of polymers containing a repeating unit represented by Chemical Formula 5 are not particularly limited, and for example, include SMA (Cray Valley), Xiran (Polyscope), Scripset (Solenis), Isobam (Kuraray), Polyanhydride resin (Chevron Phillips Chemical Company), Maldene (Lindau Chemicals), and the like.

Further, the alkali-soluble resin containing at least one repeating unit represented by Chemical Formula 3 and at least one repeating unit represented by Chemical Formula 4 can be produced by the reaction of a compound represented by the following Chemical Formula 8 and a compound represented by the following Chemical Formula 9.

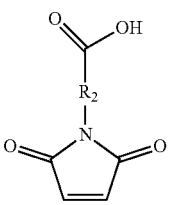

[Chemical Formula 8]

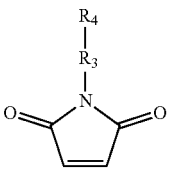

[Chemical Formula 9]

In Chemical Formulas 8 and 9, $R_2$ to $R_4$ are the same as those described above in Chemical Formulas 3 and 4.

Further, the alkali-soluble resin may be a well-known and commonly used carboxyl group-containing resin or phenol group-containing resin including a carboxyl group or a phenol group in its molecule. Preferably, a carboxyl group-containing resin or a mixture of the carboxyl group-containing resin and the phenol group-containing resin may be used.

Examples of the carboxyl group-containing resin include the resins listed in the following (1) to (7):

(1) a carboxyl group-containing resin obtained by reacting a polyfunctional epoxy resin with a saturated or unsaturated monocarboxylic acid followed by reacting with a polybasic acid anhydride, (2) a carboxyl group-containing resin obtained by reacting a bifunctional epoxy resin with a bifunctional phenol and(or) a dicarboxylic acid followed by reacting with a polybasic acid anhydride, (3) a carboxyl group-containing resin obtained by reacting a polyfunctional phenolic resin with a compound having one epoxy group in a molecule followed by reacting with a polybasic acid anhydride, (4) a carboxyl group-containing resin obtained by reacting a compound having two or more alcoholic hydroxyl groups in a molecule with a polybasic acid anhydride, (5) a polyamic acid resin obtained by reacting diamine and dianhydride or a copolymer resin of the polyamic acid resin, (6) a polyacrylic acid resin reacted with an acrylic acid or a copolymer of the polyacrylic acid resin, and (7) a resin prepared by ring-opening a maleic anhydride resin reacted with maleic anhydride and an anhydride of a maleic anhydride copolymer with a weak acid, a diamine, an imidazole, or dimethyl sulfoxide, but are not limited thereto.

More specific examples of the carboxyl group-containing resin include CCR-1291H (Nippon Kayaku), SHA-1216CA60 (Shin-A T&C), Noverite K-700 (Lubrizol), or a mixture of two or more thereof.

Examples of the phenolic group-containing resin are not particularly limited, but for example, novolac resins such as phenol novolac resin, cresol novolac resin, bisphenol F (BPF) novolac resin, or bisphenol A based resins such as 4,4'-(1-(4-(2-(4-hydroxyphenyl)propan-2-yl)phenyl)ethane-1,1-diyl)diphenol can be used alone or in combination.

The alkali-soluble resin may have an acid value of 50 mgKOH/g to 250 mgKOH/g, or 70 mgKOH/g to 200 mgKOH/g, as determined by KOH titration. Examples of the method of measuring the acid value of the alkali-soluble resin are not particularly limited, but for example, the following method can be used. A KOH solution (solvent: methanol) having a concentration of 0.1 N was prepared as a base solution, and alpha-naphtholbenzein (pH: 0.8 to 8.2 yellow, 10.0 blue green) was prepared as an indicator. Subsequently, about 1 g to 2 g of the alkali-soluble resin was collected as a sample and dissolved in 50 g of dimethylformaldehyde (DMF) solvent to which an indicator was added and then titrated with a base solvent. The acid value was determined in units of mg KOH/g with the amount of base solvent used at the time of completion of the titration.

When the acid value of the alkali-soluble resin is excessively reduced to less than 50 mgKOH/g, the developing property of the alkali-soluble resin is lowered, thus making it difficult to proceed with the development process. In addition, when the acid value of the alkali-soluble resin is excessively increased to more than 250 mgKOH/g, phase separation with other resins may occur due to an increase in polarity.

The polymer resin layer may further include at least one additive selected from the group consisting of a heat-curing catalyst, an inorganic filler, a leveling agent, a dispersant, a releasing agent, and a metal adhesion promoting agent.

The heat-curing catalyst serves to promote heat-curing of the heat-curable binder. Examples of the heat-curing catalyst include imidazole derivatives such as imidazole, 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; amine compounds such as dicyandiamide, benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic acid dihydrazide and sebacic acid dihydrazide; phosphorus compounds such as triphenylphosphine; and the like. Examples of commercially available products include 2MZ-A, 2MZ-OK, 2PHZ, 2P4BHZ, and 2P4MHZ (product names of imidazole-based compounds) manufactured by Shikoku Chemicals Corporation, U-CAT3503N and UCAT3502T (product names of block isocyanate compounds of dimethylamine), DBU, DBN, U-CATS A102, U-CAT5002 (bicyclic amidine compounds and salts thereof) manufactured by San-Apro Ltd., and the like. However, the heat-curing catalyst is not limited to these, and may also be a heat-curing catalyst for the epoxy resins or the oxetane compounds, or a compound accelerating the reaction of the epoxy group and/or the oxetanyl group with the carboxy group. These catalysts may be used alone or as a mixture of two or more thereof. Furthermore, S-triazine derivatives such as guanamine, acetoguanamine, benzoguanamine, melamine, 2,4-diamino-6-methacryloyloxyethyl-S-triazine, 2-vinyl-4,6-diamino-S-triazine, 2-vinyl-4,6-diamino-S-triazine, a 2-vinyl-4,6-diamino-S-triazine-isocyanuric acid adduct, a 2,4-diamino-6-methacryloyloxyethyl-S-triazine-isocyanuric acid adduct, etc. may be used. Preferably, a compound that also functions as these adhesion-imparting agents may be used in combination with the heat-curing catalyst.

Examples of the inorganic filler include silica, barium sulfate, barium titanate, talc, clay, magnesium carbonate, calcium carbonate, aluminum oxide, aluminum hydroxide, mica, or a mixture of two or more thereof.

The content of the inorganic filler is not particularly limited. However, in order to achieve high rigidity of the polymer resin layer, the inorganic filler may be added in an amount of 100 parts by weight or more, 100 parts by weight to 300 parts by weight, or 100 parts by weight to 200 parts by weight, based on 100 parts by weight of all the resin components contained in the polymer resin layer.

Examples of the releasing agent include polyalkylene waxes such as low molecular weight polypropylene and low molecular weight polyethylene, ester wax, carnauba wax, paraffin wax, and the like.

The metal adhesion promoting agent may be a material that does not generate surface deterioration or transparency problems of the metal material, for example, a silane coupling agent, an organic metal coupling agent, or the like.

The leveling agent serves to remove popping or craters on the surface during film coating, and for example, BYK-380N, BYK-307, BYK-378, and BYK-350 available from BYK-Chemie GmbH and the like can be used.

The polymer resin layer may further include a resin or elastomer having a molecular weight of 5000 g/mol or more and that is capable of causing phase separation. Thereby, a cured product of the polymer resin layer can be subjected to a roughening treatment. Examples of the method of determining the molecular weight of the resin or elastomer having a molecular weight of 5000 g/mol or more are not particularly limited, and for example, it means a weight average molecular weight in terms of polystyrene measured by GPC (gel permeation chromatography). In the process of determining the weight average molecular weight in terms of polystyrene measured by GPC, a commonly known analyzing device, a detector such as a differential refractive index detector, and an analytical column can be used. Commonly applied conditions for temperature, solvent, and flow rate can be used. Specific examples of the measurement conditions include a temperature of 30° C., a chloroform solvent, and a flow rate of 1 mL/min.

In addition, in order to impart photo-curable properties to the polymer resin layer, the polymer resin layer may further include a heat-curable binder containing a photoreactive unsaturated group or an alkali-soluble resin containing photoreactive unsaturated group, and a photoinitiator. Specific examples of the heat-curable binder containing a photoreactive unsaturated group, the alkali-soluble resin containing a photoreactive unsaturated group, and the photoinitiator are not particularly limited, and various compounds used in the technical field related to the photo-curable resin composition may be used without any limitation.

The content of the photoinitiator contained in the polymer resin layer may be 0.01% by weight or less based on the total weight of the polymer resin layer. The phrase "the content of the photoinitiator contained in the polymer resin layer is 0.01 wt % or less based on the total weight of the polymer resin layer" may mean that the content of the photoinitiator contained in the polymer resin layer is very small or that no photoinitiator is included. Thereby, the interface detachment of the insulating layer and the conductive layer that can occur by the photoinitiator can be decreased, and thus the adhesion and durability of the insulating layer can be improved.

The thickness of the polymer resin layer may be 1 μm to 500 μm, 3 μm to 500 μm, 3 μm to 200 μm, 1 μm to 60 μm, or 5 μm to 30 μm.

Examples of the process for forming the polymer resin layer containing an alkali-soluble resin and a heat-curable binder formed on a substrate are not particularly limited. However, for example, a process in which the polymer resin composition for forming the polymer resin layer is directly coated onto the substrate, or the polymer resin composition is coated onto the carrier film to form a polymer resin layer, and then the substrate and the polymer resin layer are laminated, can be used.

Preferably, a process of forming an adhesive layer on the substrate, coating the polymer resin composition directly onto the adhesive layer, or coating the polymer resin composition on the carrier film to form a polymer resin layer, and then laminating the adhesive layer and the polymer resin layer on the substrate, or a process of coating the polymer resin composition on the carrier film to form a polymer resin layer, forming an adhesive layer on the polymer resin layer and then laminating the substrate and the adhesive layer, and the like, can be used.

Examples of the adhesive layer are not particularly limited, and various adhesive layers widely known in the field of semiconductor elements and electric and electronic materials can be used without limitation. For example, a debondable temporary adhesive or a die attach film (DAF) can be used.

The photosensitive resin layer is a film that can exhibit photosensitivity and alkaline solubility. Thus, deformation of the molecular structure may be generated by an exposure process of irradiating the photosensitive resin layer with light, and the photosensitive resin layer may be etched or removed by a developing process of contacting an alkaline developer.

Examples of the process of forming the photosensitive resin layer are not particularly limited, but for example, a process of laminating a photosensitive resin in the form of a film such as a photosensitive dry film resist, or a process of coating a photosensitive resin composition by a spraying or dipping method and pressing it, and the like can be used.

The thickness of the photosensitive resin layer formed on the polymer resin layer may be 1 μm to 500 μm, 3 μm to 500 μm, 3 μm to 200 μm, 1 μm to 60 μm, or 5 μm to 30 μm. If the thickness of the photosensitive resin layer is excessively increased, the resolution of the polymer resin layer may be reduced.

Examples of the process of sealing the semiconductor element as described above are not particularly limited, but for example, at least two or more semiconductor elements can be dispersed and contacted on one side of the photosensitive resin layer, and the semiconductor element can be sealed by the photosensitive resin layer and the polymer resin layer through a process of laminating the photosensitive resin layer in contact with the semiconductor element with the polymer resin layer as described above. In this way, as the polymer resin layer is located between the substrate and the semiconductor element, direct contact between the substrate and the semiconductor element can be blocked.

More specifically, as shown in steps <1> to <3> of FIG. 1, the step of sealing at least two or more semiconductor elements between a photosensitive resin layer and a polymer resin layer containing an alkali-soluble resin and a heat-curable binder formed on a substrate may include a step of forming at least two or more semiconductor elements on the adhesive film (step <1> in FIG. 1); a step of forming the polymer resin layer on the substrate; a step of contacting the adhesive film with a polymer resin layer including an alkali-soluble resin and a heat-curable binder formed on a substrate (step <2> in FIG. 1); and a step of peeling the adhesive film and forming the photosensitive resin layer (step <3> in FIG. 1).

In the step of forming at least two or more semiconductor elements on the adhesive film, it is preferable that at least two or more semiconductor elements are adhered to the adhesive film in a dispersed state without contacting each other. This is for the purpose of independently separating at least two or more semiconductor elements by the alkali development described later.

In the step of contacting the adhesive film with the polymer resin layer including an alkali-soluble resin and a heat-curable binder formed on a substrate, the polymer resin layer can be brought into contact with the surface of the adhesive film excluding the contact surface between the semiconductor element and the adhesive film, and on the surface of the semiconductor element excluding the contact surface between the semiconductor element and the adhesive film, thereby sealing the semiconductor element between the adhesive film and the polymer resin layer. At this time, the substrate may be brought into contact with an opposite side of the one surface of the polymer resin layer making contact with the adhesive film directly or through an adhesive layer (or a cohesive layer).

Then, in the step of releasing the adhesive film and forming the photosensitive resin layer, the adhesive film is physically peeled off, and then the photosensitive resin layer can be formed as it is in the place where the adhesive film had been located. Thereby, the semiconductor element can be sealed between the photosensitive resin layer and the polymer resin layer.

Examples of the adhesive film are not particularly limited, and various adhesive films widely known in the field of semiconductor elements and electric and electronic materials can be used without limitation. For example, a thermal-release PSA tape or a UV-release PSA tape and the like can be used.

Second Step: Exposing to Light and Alkali-Developing the Photosensitive Resin Layer to Form a Photosensitive Resin Block, Alkali-Developing an Exposed Polymer Resin Layer to Form a Polymer Resin Block As the photosensitive resin layer is exposed and alkali-developed, when a portion of the photosensitive resin layer is selectively exposed to light and then developed with an alkali, the exposed portion is not developed and only the unexposed portion can be selectively etched and removed. In this process, the photosensitive resin layer can be divided into a plurality of photosensitive resin blocks.

Specifically, it can be confirmed through FIG. 1 that, for example, in step <2>, the photosensitive resin blocks (7) divided into four parts are formed by selective exposure and alkali-development of the photosensitive resin layer (6).

As described above, the photosensitive resin block means a part divided from the photosensitive resin layer, Specifically, the maximum longitudinal cross-sectional length of the photosensitive resin block is smaller than the maximum longitudinal cross-sectional length of the photosensitive resin layer. The maximum longitudinal cross-sectional length means a longitudinal cross-sectional length having a maximum value among all the longitudinal cross-sectional length with respect to the photosensitive resin block or photosensitive resin layer. The longitudinal cross-section means a section obtained by cutting an object in the longitudinal direction.

Specifically, the maximum longitudinal cross-sectional length of the photosensitive resin block is 100 mm or less, 1 mm to 100 mm, or 10 mm to 50 mm. The maximum longitudinal cross-sectional length of the photosensitive resin block may be 50% or less, 1% to 50%, or 5% to 20%, with respect to the maximum longitudinal cross-sectional length of the photosensitive resin layer. Meanwhile, the maximum longitudinal cross-sectional length of the photosensitive resin layer may be 150 mm or more, 150 mm to 500 mm, or 150 mm to 300 mm.

Examples of the process of exposing the photosensitive resin layer are not particularly limited, but for example, the exposure can be selectively performed through a process of contacting a photomask formed with a predetermined pattern for forming the photosensitive resin block on the photosensitive resin layer followed by irradiating with ultraviolet rays, a process of imaging a predetermined pattern included in the mask through the projection objective lens followed by irradiating with ultraviolet rays, a process of directly imaging a predetermined pattern using a laser diode as a light source followed by irradiating with ultraviolet rays, or the like. In this case, an example of the ultraviolet irradiation condition may include irradiating with a light amount of 5 mJ/cm$^2$ to 600 mJ/cm$^2$.

Further, as an example of a process of performing alkaline development after exposure of the photosensitive resin layer, a method of treating with an alkaline developer may be mentioned. Examples of the alkaline developer are not particularly limited, but for example, the alkaline aqueous solution such as potassium hydroxide, sodium hydroxide, sodium carbonate, potassium carbonate, sodium phosphate, sodium silicate, ammonia, tetramethylammonium hydroxide, amines, and the like can be used by adjusting the concentration and temperature thereof. Commercially available alkaline developers can also be used. The specific use amount of the alkaline developer is not particularly limited, but it is necessary to adjust the concentration and temperature so as to not damage the photosensitive resin pattern. For example, a 0.5% to 3% aqueous solution of sodium carbonate at 25° C. to 35° C. may be used.

The rate of removal of the photosensitive resin block during the alkali development of the photosensitive resin layer may be 0.01% by weight or less relative to the total weight of the photosensitive resin block. The phrase "the rate of removal of the photosensitive resin block is 0.01% by weight or less relative to the total weight of the photosensitive resin block" may mean that the rate to which the photosensitive resin block has been removed is very insignificant, or the photosensitive resin block is not removed at all.

Meanwhile, the above-described photosensitive resin block is formed and simultaneously the exposed polymer resin layer can also be developed with an alkali to form a polymer resin block. That is, the photosensitive resin layer is exposed to light and then alkali-developed to form a photosensitive resin block, and simultaneously the polymer resin layer exposed by the photosensitive resin block can be alkali-developed.

As described above, in the photosensitive resin layer, the exposed portion cannot be developed and only the unexposed portion can be selectively etched and removed to form a fine and uniform opening. Only a portion of the surface of the polymer resin layers exposed through the opening may be selectively removed while being in contact with the alkaline developer to form a polymer resin block.

That is, in the step of alkali-developing the polymer resin layer exposed by the photosensitive resin block, because the photosensitive resin block is not removed by an alkaline developer, it is used as a resist mask in a state where it remains intact. The alkaline developer can be brought into contact with the polymer resin layer located at the lower part of the photosensitive resin block through the opening of the photosensitive resin block.

In this case, as the polymer resin layer includes an alkali-soluble resin, it has alkaline solubility such that it is dissolved by the alkaline developer. Therefore, the portion of the polymer resin layer contacting the alkali developer can be dissolved and removed.

Therefore, the polymer resin layer exposed by the photosensitive resin block means the portion of the polymer resin layer of which the surface is not brought into contact with the photosensitive resin block, and the step of alkaline-developing the polymer resin layer exposed by the photosensitive resin block may include a step in which the alkaline developer used at the time of forming the photosensitive resin block passes through the photosensitive resin block and comes into contact with the underlying polymer resin layer.

By the step of alkaline-developing the polymer resin layer exposed by the photosensitive resin block, a polymer resin block having a shape similar to that of the photosensitive resin block can be formed on the polymer resin layer.

In this manner, as formation of the photosensitive resin block through the exposure and development of the photosensitive resin layer and formation of the polymer resin block through the development of the polymer resin layer are carried out simultaneously with one alkaline developer, the mass production can be promptly carried out and thus the efficiency of a process can be improved, and a polymer resin block having a shape similar to that of the photosensitive resin block can be easily introduced by a chemical method.

Specifically, it can be confirmed through FIG. 1 that for example, in step <5>, the portion exposed by the photosensitive resin block (7) among the polymer resin layer (5) is removed and simultaneously a polymer resin block (8) is formed.

As described above, the photosensitive resin block means a portion that is divided from the photosensitive resin layer. Specifically, the maximum longitudinal cross-sectional length of the photosensitive resin block is smaller than the maximum longitudinal cross-sectional length of the photosensitive resin layer. The maximum longitudinal cross-sectional length means a longitudinal cross-sectional length having the maximum value among all the longitudinal cross-sectional lengths with respect to the photosensitive resin block or the photosensitive resin layer. Specifically, the maximum longitudinal cross-sectional length of the polymer resin block is 100 mm or less, 1 mm to 100 mm, or 10 mm to 50 mm, and the maximum longitudinal cross-sectional length of the polymer resin block may be 50% or less, 1% to 50%, or 5% to 20%, with respect to the maximum cross-sectional length of the polymer resin layer. Meanwhile, the maximum longitudinal cross-sectional length of the polymer resin layer may be 150 mm or more, 150 mm to 500 mm, or 150 mm to 300 mm.

On the other hand, in the above-described alkali developing step, at least one semiconductor element can be sealed between the photosensitive resin block and the polymer resin block which are in contact with each other. That is, at least one semiconductor element may be present in a sealed state in the laminate of the photosensitive resin block and the polymer resin block generated by dividing the laminate of the photosensitive resin layer and the polymer resin layer.

The at least one semiconductor element means one semiconductor element or two or more semiconductor elements, and there is no limit on the specific number.

In this way, a miniaturized semiconductor package can be formed in a state where at least one semiconductor element is sealed between the photosensitive resin block and the polymer resin block. Due to a decrease in the maximum longitudinal cross-sectional length of the polymer resin block, the occurrence of warpage during curing can be minimized, thereby realizing a stable semiconductor package.

Specifically, it can be confirmed through FIG. 1 that for example, in step <5>, one semiconductor element (2) is sealed by a photosensitive resin block (7) and a polymer resin block (8) which are in contact with each other.

For this purpose, in the alkali developing step, the photosensitive resin layer or the polymer resin layer located between adjacent semiconductor elements can be removed. More specifically, the photosensitive resin layer or the polymer resin layer located at 10% to 90%, 30% to 70%, or 40% to 60% of the distance between adjacent semiconductor elements can be removed. The distance between adjacent semiconductor elements means the minimum distance from the end of one semiconductor element to the end of another semiconductor element in two adjacent semiconductor elements. When the entire distance between the adjacent semiconductor elements is 100%, the photosensitive resin layer or the polymer resin layer existing between the position of 10% and the position of 90% of the distance can be removed.

When the photosensitive resin layer or the polymer resin layer at a position corresponding to less than 10% or more than 90% of the distance between adjacent semiconductor elements is removed, the semiconductor element to be sealed by the photosensitive resin block and the polymer resin block making contact with each other can be exposed.

Third Step: Curing the Polymer Resin Block to Form the Insulating Layer

In the step of curing the polymer resin block, examples of the specific curing method are not particularly limited, and any of the heat-curing or photo-curing methods may be used without limitation.

Through the curing step of the polymer resin block, a main chain including an ester bond can be formed in the polymer resin block. Examples of forming the ester bond include a method of photo-curing through acrylic resin in which acrylic acid is ester-bonded, or a method of heat-curing such that an ester bond is formed by reaction of carboxylic acid and epoxy.

In this case, the specific heat-curing conditions are not limited, and the heat-curing step of the polymer resin block can be performed at a temperature of 50° C. to 150° C. for 0.1 to 2 hours. When the heat-curing temperature of the polymer resin block is too low or the heat-curing time becomes shorter, the polymer resin block can be excessively damaged by a peeling liquid. Further, when the heat-curing temperature of the polymer resin block is high or the heat-curing time becomes longer, excessive warpage may occur in the polymer resin block.

Meanwhile, after the step of curing the polymer resin block, a step of removing the photosensitive resin block can be further included. As described above, in the method for manufacturing the insulating layer according to the embodiment, before the step of peeling the photosensitive resin block, a step of curing the polymer resin block can proceed in advance. This is because if the curing of the polymer resin block does not proceed before the peeling step of the photosensitive resin block, the uncured polymer resin block may also be removed in the peeling step of the photosensitive resin block. Therefore, by pre-curing the polymer resin block before the peeling step of the photosensitive resin block, the effect of stably maintaining the structure of the insulating layer can be realized.

Examples of the process of removing the polymer resin block are not particularly limited, and a photoresist peeling liquid can be treated, or a desmear process, plasma etching, or the like can be performed. An etchant that does not affect the lower copper line can be used. However, it is preferable to use a method which selectively removes only the photosensitive resin block and does not affect the lower polymer resin layer.

Further, in the method of manufacturing an insulating layer according to the embodiment, after the step of removing the photosensitive resin block, a step of curing the polymer resin block at a temperature of 150° C. to 250° C. for 0.1 to 10 hours can be further included. If the curing step of the polymer resin block in the third step described above is a first curing step, the second curing step can be performed on the polymer resin block after the peeling step of the photosensitive resin block as described above. Thereby, the chemical resistance of the finally manufactured insulating layer can be improved.

In the step of curing the polymer resin block, examples of the specific curing method are not particularly limited, and any of the heat-curing or photo-curing methods may be used without limitation.

Through the curing step of the polymer resin block, a main chain including an ester bond can be formed in the polymer resin block. Examples of forming the ester bond include a method of photo-curing through acrylic resin in which acrylic acid is ester-bonded, or a method of heat-curing such that an ester bond is formed by reaction of carboxylic acid and epoxy.

According to another embodiment of the present invention, may be provided a method for manufacturing a semiconductor package may be provided, including the steps of: forming an insulating pattern layer on the insulating layer manufactured by the method of manufacturing an insulating layer according to the embodiment; and forming a metal pattern layer on the insulating pattern layer.

The insulating layer manufactured in this embodiment may be used as an interlayer insulating material of a semiconductor package, and may include a cured product, specifically, a heat-cured product or a photo-cured product, of an alkali-soluble resin and a heat-curable binder. Details of the alkali-soluble resin and the heat-curable binder include those described above in the one embodiment.

First, in the step of forming the insulating pattern layer on the insulating layer manufactured by the method for manufacturing the insulating layer according to the embodiment described above, the insulation of the semiconductor element exposed on the surface of the insulating layer can be carried out.

Specifically, the step of forming the insulating pattern layer on the insulating layer may include a step of: forming a polymer resin layer and a photosensitive resin layer on the polymer resin block and the semiconductor element included in the insulating layer; exposing and alkali-developing the photosensitive resin layer to form a photosensitive resin pattern and simultaneously alkali-developing the polymer resin layer exposed by the photosensitive resin pattern; and curing the polymer resin layer.

In the step of forming a polymer resin layer and a photosensitive resin layer on the polymer resin block and the semiconductor element included in the insulating layer, details of the polymer resin block, the semiconductor element, the polymer resin layer, and the photosensitive resin layer include those described above in the one embodiment.

Examples of the process of forming the photosensitive resin layer on the polymer resin layer are not particularly limited, but for example, a process of laminating a photosensitive resin in the form of a film such as a photosensitive dry film resist on the polymer resin layer, or a process of coating a photosensitive resin composition on the polymer resin layer by a spraying or dipping method and pressing it, and the like, can be used.

The thickness of the polymer resin layer may be 1 µm to 500 µm, 3 µm to 500 µm, 3 µm to 200 µm, 1 µm to 60 µm, or 5 µm to 30 µm. The thickness of the photosensitive resin layer formed on the polymer resin layer may be 1 µm to 500 µm, 3 µm to 500 µm, 3 µm to 200 µm, 1 µm to 60 µm, or 5 µm to 30 µm. When the thickness of the photosensitive resin layer is excessively increased, the resolution of the polymer resin layer can be reduced.

In the step of exposing and alkali-developing the photosensitive resin layer to form a photosensitive resin pattern and simultaneously alkali-developing the polymer resin layer exposed by the photosensitive resin pattern, the photosensitive resin layer may exhibit photosensitivity and alkaline solubility. Thus, deformation of the molecular structure may be generated by an exposure step of irradiating the photosensitive resin layer with light, and the photosensitive resin layer may be etched or removed by a developing step of contacting an alkaline developer thereto.

Therefore, when a portion of the photosensitive resin layer is selectively exposed to light and then developed with an alkali, the exposed portion is not developed and only the unexposed portion can be selectively etched and removed. As described above, a portion of the photosensitive resin layer remaining intact without being alkali-developed by exposure is referred to as a photosensitive resin pattern.

That is, as an example of the process of exposing the photosensitive resin layer, the exposure can be selectively performed though a process of contacting a photomask having a predetermined pattern formed on the photosensitive resin layer and then irradiating ultraviolet rays, a process of imaging a predetermined pattern included in the mask through a projection objective lens and then irradiating ultraviolet rays, a process of directly imaging a pattern using a laser diode as a light source and then irradiating ultraviolet rays, or the like. An example of the ultraviolet irradiation condition may include irradiating a light amount of 5 mJ/cm$^2$ to 600 mJ/cm$^2$.

Further, examples of the process of alkali-developing the photosensitive resin layer after exposure may include a process of treating with an alkaline developer. Examples of the alkaline developer are not particularly limited, but for example, an alkaline aqueous solution such as potassium hydroxide, sodium hydroxide, sodium carbonate, potassium carbonate, sodium phosphate, sodium silicate, ammonia, tetramethylammonium hydroxide, amines, and the like can be used by adjusting the concentration and temperature thereof, and an alkaline developer sold as a product can also be used. The specific use amount of the alkaline developer is not particularly limited, but it is necessary to adjust the concentration and temperature so as to not damage the photosensitive resin pattern. For example, a 0.5% to 3% aqueous sodium carbonate solution at 25° C. to 35° C. may be used.

The rate of removal of the photosensitive resin pattern may be 0.01% by weight or less relative to the total weight of the photosensitive resin pattern. The phrase "the rate of removal of the photosensitive resin pattern is 0.01% by weight or less relative to the total weight of the photosensitive resin pattern" may mean that the rate to which the photosensitive resin pattern has been removed is very insignificant, or the photosensitive resin pattern is not removed at all.

Thereby, the photosensitive resin layer is exposed and alkali-developed to form a photosensitive resin pattern, and simultaneously the polymer resin layer exposed by the photosensitive resin pattern can be alkali-developed. As described above, the photosensitive resin layer can be formed into a fine and uniform pattern by utilizing the photosensitivity, and through a process by which only a part of the surface of the polymer resin layer exposed through the pattern formed on the photosensitive resin layer is selectively brought into contact with the alkaline developer, the equivalent level or higher of precision and higher process economics can be ensured while replacing a conventional laser etching process.

That is, in the step of alkaline-developing the polymer resin layer exposed by the photosensitive resin pattern, because the photosensitive resin pattern is not removed by an alkaline developer, it is used as a resist mask in a state where it remains intact, and the alkaline developer can be brought into contact with the polymer resin layer positioned at the lower part of the photosensitive resin layer through the opening of the photosensitive resin pattern. In this case, as the polymer resin layer includes an alkali-soluble resin, it has alkaline solubility such that it is dissolved by the alkaline developer. Therefore, the portion of the polymer resin layer contacting the alkali developer can be dissolved and removed.

Therefore, the polymer resin layer exposed by the photosensitive resin pattern means the portion of the polymer resin layer whose surface is not brought into contact with the photosensitive resin pattern, and the step of alkaline-developing the polymer resin layer exposed by the photosensitive resin pattern may include a step in which the alkaline developer used at the time of forming the photosensitive resin pattern passes through the photosensitive resin pattern and comes into contact with the underlying polymer resin layer.

By the step of alkaline-developing the polymer resin layer exposed by the photosensitive resin pattern, a polymer resin pattern having the same shape as the photosensitive resin pattern can be formed on the polymer resin layer. A part of the polymer resin layer which remains intact without being alkaline-developed like the photosensitive resin pattern can be referred to as a polymer resin pattern.

As described above, as the pattern formation through the development of the photosensitive resin layer and the pattern formation through the development of the polymer resin layer proceed simultaneously in one alkaline developer, mass production can be carried out rapidly and thus the efficiency of a process can be improved, and a fine pattern having the same shape as the fine pattern formed on the photosensitive resin layer can be easily introduced into the polymer resin layer by a chemical method.

In the step of curing the polymer resin layer, damage to the polymer resin layer during the subsequent peeling step of the photosensitive resin pattern can be minimized. At this time, the specific heat curing conditions are not limited, and the curing can be performed by adjusting the preferred conditions according to the peeling method of the photosensitive resin pattern. For example, when the photoresist peeling liquid is treated to peel off the photosensitive resin pattern, the step of heat-curing the polymer resin layer may be carried out at a temperature of 60° C. to 150° C. for 5 minutes to 2 hours. When the heat-curing temperature of the polymer resin layer is too low or the heat-curing time is shortened, the polymer resin layer can be damaged by a peeling liquid. Further, when the heat-curing temperature of the polymer resin layer is high or the heat-curing time becomes longer, it may be difficult to remove the photosensitive resin pattern by the peeling liquid.

As another example, when the resist mask is peeled off through a desmear process, the step of heat-curing the polymer resin layer may be performed at a temperature of 150° C. to 230° C. for 1 to 4 hours.

The method may further include peeling the photosensitive resin pattern after heat-curing. When removing the photosensitive resin pattern, it is preferable to use a method that can remove only the photosensitive resin layer without removing the lower polymer resin layer as much as possible. In addition, a part of the polymer resin layer may be removed in order to adjust the shape of the opening pattern or to remove the residues of the polymer resin layer that can remain on the bottom surface of the opening pattern.

That is, in the step of peeling the photosensitive resin pattern, the rate of removal of the polymer resin layer may be 10% by weight or less, 1% by weight or less, or 0.01% by weight or less, relative to the total weight of the polymer resin layer. The phrase "the rate of removal of the polymer resin layer is 0.01% by weight or less relative to the total weight of the polymer resin layer" may mean that the rate to which the polymer resin layer has been removed is very insignificant, or the polymer resin layer is not removed at all.

As a specific example of the peeling process of the photosensitive resin pattern, a photoresist peeling liquid can be treated, or a desmear step, plasma etching, or the like can be performed, and the above methods can be used in combination.

Examples of the peeling step using the photoresist peeling liquid are not particularly limited, but for example, it can be used by adjusting the concentration and the temperature of the alkali aqueous solution such as potassium hydroxide, sodium hydroxide, and the like. A commercially available product such as a Resistrip product group (manufactured by Atotech), or ORC-731, ORC-723K, ORC-740, and SLF-6000 (manufactured by Orchem Corporation) can also be used. The specific use amount of the photoresist peeling liquid is not particularly limited, but it is necessary to adjust the concentration and temperature so as to not damage the pattern of the lower polymer resin layer. For example, a 1% to 5% aqueous sodium carbonate solution at 25° C. to 60° C. may be used.

Examples of the peeling process using the desmear step are not particularly limited, but for example, commercially available products, for example, Atotech's desmear process chemicals including SWELLER chemicals such as Securiganth E, Securiganth HP, Securiganth BLG, Securiganth MV SWELLER, Securiganth SAP SWELLER, and the like, permanganic acid chemicals such as Securiganth P 500, Securiganth MV ETCH P, and Securiganth SAP ETCH P, reducing agent chemicals such as Securiganth E Reduction Cleaner, Securiganth HP Reduction Cleaner, Securiganth BLG Reduction Cleaner, Securiganth MV Reduction Cleaner, Securiganth SAP Reduction Cleaner, and the like, or Orchem's desmear process chemicals including SWELLER chemicals such as ORC-310A, ORC-315A, ORC-315H, ORC-312, and the like, or permanganic acid chemicals such as ORC-340B, reducing agent chemicals such as ORC-370, ORC-372, and the like, can be used in accordance with each process condition.

Further, after the step of removing the photosensitive resin pattern, a step of curing the polymer resin layer at a temperature of 150° C. to 250° C. for 0.1 hours to 10 hours can be further included. Thereby, the chemical resistance of the finally manufactured insulating layer can be improved.

Meanwhile, the step of forming a metal pattern layer on the insulating pattern layer may include the steps of: forming a metal thin film on the insulating layer; forming a photosensitive resin layer on which a pattern is formed on the metal thin film; depositing a metal on the metal thin film exposed by the photosensitive resin layer pattern; and removing the photosensitive resin layer and removing the exposed metal thin film.

In the step of forming the metal thin film on the insulating pattern layer, examples of a method of forming the metal thin film include a dry deposition process or a wet deposition process, and specific examples of the dry deposition process include vacuum deposition, ion plating, sputtering, and the like.

Meanwhile, as a specific example of the wet deposition process, electroless plating of various metals and the like may be mentioned. Electroless copper plating is commonly used, and a roughening treatment step can be further included before or after vapor deposition.

The roughening treatment process may be dry and wet processes depending on the conditions. Examples of the dry process include vacuum treatment, atmospheric pressure treatment, gas plasma treatment, gas Excimer UV treatment, and the like. Examples of the wet process include desmear treatment. Through these roughening treatment processes, it is possible to increase the surface roughness of the metal thin film and thus improve the adhesion to the metal deposited on the metal thin film.

Further, the step of forming the metal thin film on the insulating layer may further include a step of forming a surface treatment layer on the insulating layer before depositing the metal thin film. Thereby, the adhesion between the metal thin film and the insulating layer can be improved.

Specifically, as an example of a method of forming a surface treatment layer on the insulating pattern layer, at least one selected among an ion assisted reaction method, an ion beam treatment method, and a plasma treatment method can be used. The plasma treatment method may include any one of an atmospheric plasma treatment method, a DC plasma treatment method, and an RF plasma treatment method. As a result of the surface treatment process, a surface treatment layer containing a reactive functional group can be formed on the surface of the insulating layer. As another example of a method of forming a surface treatment layer on the insulating pattern layer, a method of depositing chromium (Cr) and titanium (Ti) metal with a thickness of 50 nm to 300 nm on the surface of the insulating pattern layer may be mentioned.

Meanwhile, the step of forming a photosensitive resin layer in which a pattern is formed on the metal thin film may include a step of exposing and developing the photosensitive resin layer formed on the metal thin film. Details of the photosensitive resin layer and the exposure and development may include those described above in the one embodiment.

In the step of depositing the metal on the metal thin film exposed by the photosensitive resin layer pattern, the metal thin film exposed by the photosensitive resin layer pattern means the portion of a metal thin film which is not brought in contact with the photosensitive resin layer on the surface. The metal to be deposited may be copper. Examples of the deposition method are not particularly limited, and various well-known physical or chemical vapor deposition methods may be used without limitation. As a general example, an electrolytic copper plating method may be used.

In this case, the metal deposited on the metal thin film exposed by the photosensitive resin layer pattern can form the above-mentioned metal pattern layer, and more specifically, the metal pattern layer can be formed so as to be connected to the semiconductor element. Thus, the metal pattern layer can transmit and receive an electrical signal with the semiconductor element included in the insulating layer.

Specifically, the step of forming the metal pattern layer on the insulating pattern layer may include filling a via hole included in the pattern inside the insulating pattern layer with metal. As described above, the insulating pattern layer manufactured in the above embodiment includes a pattern including via holes (openings) therein. In the process of forming the metal pattern layer on the insulating pattern layer, the via holes (openings) inside the insulating pattern layer can be filled with this metal.

More specifically, in the step of forming a metal thin film on the insulating pattern layer, a metal thin film may be formed on the insulating layer surrounding the via holes (openings) included in the insulating pattern layer and on the surface of the lower substrate. Through the step of depositing the metal on the metal thin film, the via holes (openings) may be filled with the metal while a metal is deposited inside the via holes (openings).

By filling the fine openings (via holes) with metal as described above, it can serve as an electrical path between the lower substrate and the upper substrate with respect to the insulating layer, thereby improving the integration degree in the circuit board of the multilayered structure.

In the step of removing the photosensitive resin layer and removing the exposed metal thin film, examples of the process of removing the photosensitive resin layer include using a photoresist peeling liquid, and examples of the process of removing the metal thin film exposed due to the removal of the photosensitive resin layer include using an etchant.

The semiconductor package manufactured by the manufacturing method of the semiconductor package may be used as a build-up material again. For example, a step of forming a second metal pattern layer on the second insulating pattern layer can be further included in accordance with the method of forming the metal pattern layer. In addition, a step of forming a second metal pattern can be further included in accordance with the step of forming the metal pattern layer on the second insulting layer. The above-described additional insulating pattern layer forming step and the additional metal pattern layer forming step can be repeatedly performed.

Accordingly, the number of the layers, for example, the insulating pattern layer and the metal pattern layer, included in the semiconductor package manufactured by the manufacturing method of the semiconductor package is not particularly limited, and it may have, for example, one layer or more, or one to twenty layers, according to purpose of application and use.

Advantageous Effects

According to the present invention, a method for manufacturing an insulating layer which can minimize the degree of warpage caused by polymer shrinkage at the time of curing and secure the stability of a semiconductor chip located therein, and a method for manufacturing a semiconductor package using an insulating layer obtained from the manufacturing method of the insulating layer, can be provided.

BRIEF DESCRIPTION OF DRAWINGS

FIG. 1 schematically illustrates a manufacturing process of an insulating layer of Example 1.

FIG. 2 schematically illustrates a manufacturing process of a semiconductor package of Example 1.

DETAILED DESCRIPTION OF THE EMBODIMENTS

The present invention will be described below in more detail by way of examples. However, these examples are provided for illustrative purposes only, and should not be construed as limiting the scope of the present invention.

PRODUCTION EXAMPLES: PRODUCTION OF ALKALI-SOLUBLE RESIN

Production Example 1

632 g of dimethylformamide (DMF) as a solvent, 358 g of BMI-1100 (manufactured by Daiwakasei Industry Co., Ltd.) as an N-substituted maleimide compound, and 274 g of 4-aminophenylacetic acid as an amine compound were placed and mixed in a 2-liter reaction vessel with heating and cooling capability and equipped with a thermometer, a stirrer, a reflux condenser, and a quantitative moisture analyzer, and stirred at 85° C. for 96 hours to produce an alkali-soluble resin solution having a solid content of 50%.

Production Example 2

632 g of dimethylformamide (DMF) as a solvent, 434 g of p-carboxyphenylmaleimide as an N-substituted maleimide compound, and 198 g of 4,4-diaminodiphenyl methane as an amine compound were placed and mixed in a 2-liter reaction vessel with heating and cooling capability and equipped with a thermometer, a stirrer, a reflux condenser, and a quantitative moisture analyzer, and stirred at 85° C. for 96 hours to produce an alkali-soluble resin solution having a solid content of 50%.

Production Example 3

543 g of dimethylacetamide (DMAc) as a solvent was placed in a 2-liter reaction vessel with heating and cooling capability and equipped with a thermometer, a stirrer, a reflux condenser, and a quantitative moisture analyzer, and 350 g of SMA1000 (Cray Valley), 144 g of 4-aminobenzoic acid (PABA), and 49 g of 4-aminophenol (PAP) were added thereto and mixed. After the temperature of the reactor was set to 80° C. under a nitrogen atmosphere, the acid anhydride and the aniline derivative were reacted continuously for 24 hours to form an amic acid. Then, the temperature of the reactor was set to 150° C., and the imidization reaction was continued for 24 hours to produce an alkali-soluble resin solution having a solid content of 50%.

Production Example 4

516 g of methylethylketone (MEK) as a solvent was placed in a 2-liter reaction vessel with heating and cooling capability and equipped with a thermometer, a stirrer, a reflux condenser, and a quantitative moisture analyzer, and 228 g of p-carboxyphenylmaleimide, 85 g of p-hydroxyphenylmaleimide, 203 g of styrene, and 0.12 g of azobisisobutyronitrile (AIBN) were added thereto and then mixed. The temperature of the reactor was gradually raised to 70° C. under a nitrogen atmosphere, and then the reaction was continued for 24 hours to produce an alkali-soluble resin solution having a solid content of 50%.

Example: Manufacture of Insulating Layer and Semiconductor Package

Example 1

(1) Manufacture of Insulating Layer

As shown in FIG. 1 below, an insulating layer was manufactured in the order of the following steps <1> to <10>.

<1> A plurality (10 or more) of semiconductor chips (2) with a size of 8 mm×8 mm×80 μm were separately arranged on a UV-release adhesive film (1) at intervals of 10 mm on the top, bottom, left, and right sides.

<2> A Debondable Temporary Adhesive (4) (LG Chem) was formed on a silicon wafer (3) having a thickness of 200 μm. Then, a polymer resin composition prepared by mixing 16 g of the alkali-soluble resin synthesized in Production Example 1, 6 g of MY-510 (manufactured by Huntsman) as a heat-curable binder, and 43 g of SC2050 MTO (solid content 70%, manufactured by Adamatech) was coated onto the Debondable Temporary Adhesive (4) at a thickness of 100 μm and dried to prepare a structure in which the silicon wafer (3)—Debondable Temporary Adhesive (4)—polymer resin layer (5) were sequentially laminated. At this time, the maximum longitudinal cross-sectional length of the polymer resin layer was 200 mm.

Thereafter, the adhesive film (1) of step <1> and the polymer resin layer (5) were vacuum laminated at 85° C. to form a structure in which the silicon wafer (3)—Debondable Temporary Adhesive (4)—polymer resin layer (5)—semiconductor chip (2)—adhesive film (1) were sequentially laminated to seal the semiconductor chip (2).

<3> The adhesive surface of the adhesive film (1) was irradiated with UV to eliminate the adhesive property, and then the adhesive film (1) was peeled and removed.

<4> The adhesive film (1) was removed and simultaneously a photosensitive dry film resist (6) (KL1015, manufactured by KOLON Industries) having a thickness of 15 μm was laminated on the exposed polymer resin layer (5) and the surface of the semiconductor chip (2) at a temperature of 110° C.

<5> A negative type of photomask was brought into contact with the photosensitive dry film resist (6), and then irradiated with ultraviolet light (light amount of 25 mJ/cm$^2$). The photosensitive dry film resist (6) and the polymer resin layer (5) were simultaneously developed through a 1% sodium carbonate developer at 30° C. to form a photosensitive resin block (7) and a polymer resin block (8).

At this time, the polymer resin layer (5) and the photosensitive dry film resist (6) located at 40% to 60% of the distance between adjacent semiconductor chips (2) were removed by development, and simultaneously one semiconductor chip was included in the polymer resin block, and the maximum longitudinal cross-sectional length of the polymer resin block was 16 mm.

<6> The polymer resin block (8) was heat-cured at a temperature of 100° C. for 1 hour.

<7> The etchant was treated to remove the photosensitive resin block (7) remaining on the polymer resin block (8).

<8> The polymer resin block (8) was heat-cured at a temperature of 200° C. for 1 hour to manufacture an insulating layer.

(2) Manufacture of Semiconductor Package

As shown in FIG. 2 below, a semiconductor package was manufactured in the order of the following steps <9> to <11>.

<9> A polymer resin composition prepared by mixing 16 g of the alkali-soluble resin synthesized in Production Example 1, 5 g of MY-510 (manufactured by Huntsman) as a heat-curable binder, and 35 g of SC2050 MTO (manufactured by Adamatech) was coated onto the PET film and dried to prepare a polymer resin layer having a thickness of 15 μm. Then, the polymer resin layer was vacuum laminated on the polymer resin block (8) of the prepared insulating layer and the semiconductor chip (2) at 85° C., and the PET film was removed. A photosensitive dry film resist KL1015 (manufactured by KOLON Industries) having a thickness of 15 μm was laminated on the polymer resin layer at 110° C. A negative type of photomask was brought into contact with the photosensitive dry film resist and then irradiated with ultraviolet light (light amount of 25 mJ/cm$^2$). The photosensitive dry film resist and the polymer resin layer were simultaneously developed through a 1% sodium carbonate developer at 30° C.

At this time, the photosensitive dry film resist on which the pattern was formed acted as a protective layer of the polymer resin layer, so that the same pattern as that of the photosensitive dry film resist was also formed on the polymer resin layer.

Subsequently, after heat-curing at a temperature of 100° C. for 1 hour, the photosensitive dry film resist was removed using a 3% sodium hydroxide resist peeling liquid at a temperature of 50° C. and heat-cured at a temperature of 200° C. for 1 hour to form a first insulating pattern layer (9) having a certain pattern.

<10> A titanium-copper thin film was deposited on the first insulation pattern layer (9) using a sputterer, and heated at a temperature of 100° C. for 30 minutes to improve adhesion with the sputter layer. Then, a dry film (RY-5319, Hitachi Kasei) was laminated to form a pattern, and electroplating was performed to form a circuit in the form of a metal pattern and at the same time the via hole was filled with metal to form a metal pattern layer (10).

<11> A second insulating pattern layer (11) having a predetermined pattern was formed on the metal pattern layer (10) in the same manner as in <9>, thereby manufacturing a semiconductor package.

Example 2

An insulating layer and a semiconductor package were manufactured in the same manner as in Example 1, except that in the manufacturing stage <5> of the insulating layer of Example 1, four semiconductor chips were included in the polymer resin block, and the maximum longitudinal cross-sectional length of the polymer resin block was 34 mm.

Example 3

An insulating layer and a semiconductor package were manufactured in the same manner as in Example 1, except that in the manufacturing stage <2> of the insulating layer of Example 1, the alkali-soluble resin synthesized in Production Example 2 was used instead of the alkali-soluble resin synthesized in Production Example 1.

Example 4

An insulating layer and a semiconductor package were manufactured in the same manner as in Example 1, except that in the manufacturing step <2> of the insulating layer of Example 1, the alkali-soluble resin synthesized in Production Example 3 was used instead of the alkali-soluble resin synthesized in Production Example 1.

Example 5

An insulating layer and a semiconductor package were manufactured in the same manner as in Example 1, except that in the manufacturing step <2> of the insulating layer of Example 1, the alkali-soluble resin synthesized in Production Example 4 was used instead of the alkali-soluble resin synthesized in Production Example 1.

Comparative Examples 1 to 3: Manufacture of Insulating Layer and Semiconductor Package Comparative Example 1

<1> A plurality of semiconductor chips with a size of 8 mm×8 mm×80 μm were separately arranged on the thermal-release adhesive film at intervals of 10 mm on the top, bottom, left, and right sides.

<2> A Debondable Temporary Adhesive (LG Chem) was formed on a silicon wafer having a thickness of 200 μm. Then, a photosensitive resin composition prepared by mixing 30 g of CCR-1291H (manufactured by Nippon Kayaku) as an acid-modified acrylate resin, 5 g of TMPTA (manufactured by ETNIS) as a polyfunctional acrylate monomer, 2 g of Irgacure TPO-L (manufactured by BASF) as a photoinitiator, 6 g of YDCN-500-8P (Kukdo Chemical) as a polyfunctional epoxy, 0.2 g of 2E4MZ (manufactured by Shikoku Chem) as a heat-curable catalyst, and 49 g of SC2050 MTO (solid content 70%, manufactured by Adamatech) was coated onto the debondable temporary adhesive at a thickness of 100 μm and dried to prepare a structure in which silicon wafer—Debondable Temporary Adhesive-polymer resin layer were sequentially laminated.

Subsequently, the adhesive film 1 of step <1> and the polymer resin layer were vacuum laminated at 85° C. to form a structure in which silicon wafer-Debondable Temporary Adhesive-polymer resin layer-semiconductor chip-adhesive film were sequentially laminated to seal the semiconductor chip.

<3> The adhesive film was heated at 100° C. for 1 minute to eliminate the adhesive property, and then the adhesive film was peeled and removed.

<4> A negative type of photomask was brought into contact with the surface on which the semiconductor chip was mounted, irradiated with ultraviolet rays (light amount of 400 mJ/cm$^2$), and developed through a 1% sodium carbonate developer at 30° C. to form a photosensitive resin block and a polymer resin block.

<5> The polymer resin block (8) was irradiated with ultraviolet rays (light amount of 1500 mJ/cm$^2$) and then heat-cured at a temperature of 200° C. for 1 hour to manufacture an insulating layer.

Comparative Example 2

An insulating layer was manufactured in the same manner as in Example 1, except that the step of forming the photosensitive resin block and the polymer resin block in step <5> of Example 1 was omitted.

Comparative Example 3

An insulating layer was manufactured in the same manner as in Example 1, except that step <4> and step <5> of Example 1 were omitted and the polymer resin block was formed by dicing the polymer resin layer.

Herein, in the case of Comparative Example 3, burrs were generated in the polymer resin block formed after the dicing of the polymer resin layer, and there was a technical limitation that it was difficult to handle, for example defects were generated in subsequent processes or the silicon wafer was broken due to warpage.

Experimental Example: Measurement of Physical Properties of Insulating Layers and Semiconductor Packages Obtained in Examples and Comparative Examples The physical properties of the insulating layers and the semiconductor packages obtained in Examples 1 to 5 and Comparative Examples 1 and 2 were measured by the following methods, and the results are shown in Table 1 below.

1. Degree of Warpage

When the semiconductor packages obtained in Examples 1 to 5 and Comparative Examples 1 and 2 were placed on a flat surface, the height from the curved or bent tip to the bottom of the semiconductor package was measured.

2. Delamination

When the semiconductor packages obtained in Examples 1 to 5 and Comparative Examples 1 and 2 were separated from the debondable temporary adhesive (4), thermal stresses were applied three times under the reflow condition of TM6502.6.27. Then, using scanning acoustic tomography (SAT), the delamination of the semiconductor package was confirmed under the following criteria.
OK: No delamination was observed.
NG: Delamination was observed

TABLE 1

Results of Experimental Examples of Examples and Comparative Examples

| Category | Degree of warpage(mm) | Delamination |
|---|---|---|
| Example 1 | 3 | OK |
| Example 2 | 5 | OK |
| Example 3 | 3 | OK |
| Example 4 | 4 | OK |
| Example 5 | 4 | OK |
| Comparative Example 1 | 2 | NG |
| Comparative Example 2 | 124 | OK |

As shown in Table 1, it was confirmed that in the case of the semiconductor packages obtained in Examples 1 to 5, while the degree of warpage was as small as 10 mm or less, delamination did not occur and so excellent durability was exhibited.

On the other hand, it was confirmed that in the case of the semiconductor package obtained in Comparative Example 1, as a well-known novolac-based oligomer was used as an acid-modified resin, the delamination occurred and the durability was deteriorated.

In addition, it was confirmed that in the case of the semiconductor package obtained in Comparative Example 2, as the polymer resin layer having the maximum longitudinal cross-sectional length of 200 mm was cured without forming a polymer resin block, the degree of warpage was as high as 124 mm.

EXPLANATION OF SIGN

1: Adhesive film
2: Semiconductor chip
3: Silicon wafer, or copper-clad laminate
4: Debondable temporary adhesive or die bonding film
5: Polymer resin layer
6: Photosensitive dry film resist
7: Photosensitive resin block
8: Polymer resin block
9: First insulating pattern layer
10: Metal pattern layer
11: Second insulating layer
<1> to <11>: Order of progress of process

The invention claimed is:

1. A method for manufacturing an insulating layer, comprising:
sealing at least two or more semiconductor elements between a photosensitive resin layer and a polymer resin layer, wherein the polymer resin layer is formed on a substrate and contains an alkali-soluble resin and a heat-curable binder;
exposing to light and alkali-developing the photosensitive resin layer to form a photosensitive resin block;
alkali-developing an exposed polymer resin layer by the photosensitive resin block to form a polymer resin block; and
curing the polymer resin block to form the insulating layer,
wherein in the alkali developing step, at least one semiconductor element is sealed between the photosensitive resin block and the polymer resin block which are in contact with each other, and
wherein a maximum longitudinal cross-sectional diameter of the polymer resin block is 50% or less with respect to a maximum longitudinal cross-sectional length of the polymer resin layer.

2. The method for manufacturing an insulating layer according to claim 1,
wherein a maximum longitudinal cross-sectional length of the polymer resin block is 100 mm or less.

3. The method for manufacturing an insulating layer according to claim 1,
wherein in the alkali developing step, the photosensitive resin layer or the polymer resin layer located at 10% to 90% of a distance between adjacent semiconductor elements is removed wherein the distance between adjacent semiconductor elements is a minimum distance from the end of one semiconductor element to the end of another semiconductor element in two adjacent semiconductor elements.

4. The method for manufacturing an insulating layer according to claim 1,
wherein the alkali-soluble resin includes at least one acidic functional group, and at least one cyclic imide functional group substituted with an amino group.

5. The method for manufacturing an insulating layer according to claim 4,
wherein the cyclic imide functional group substituted with an amino group includes a functional group represented by the following Chemical Formula 1:

[Chemical Formula 1]

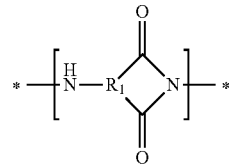

in Chemical Formula 1,
$R_1$ is an alkylene group or an alkenyl group having 1 to 10 carbon atoms forming an imide ring, and
"*" means a bonding point.

6. The method for manufacturing an insulating layer according to claim 4,
wherein the alkali-soluble resin is produced through reaction of a cyclic unsaturated imide compound and an amine compound, and the at least one of the cyclic unsaturated imide compound and the amine compound contains an acidic functional group substituted at its terminal.

7. The method for manufacturing an insulating layer according to claim 6,
wherein the amine compound includes at least one selected from the group consisting of a carboxylic acid compound substituted with an amino group and a polyfunctional amine compound containing two or more amino groups.

8. The method for manufacturing an insulating layer according to claim 1,
wherein the alkali-soluble resin includes at least one repeating unit represented by the following Chemical Formula 3 and at least one repeating unit represented by the following Chemical Formula 4:

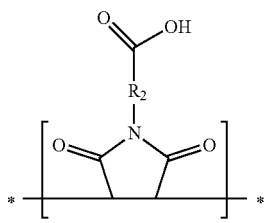

[Chemical Formula 3]

in Chemical Formula 3,

R2 is a direct bond, an alkylene group having 1 to 20 carbon atoms, an alkenyl group having 1 to 20 carbon atoms, or an arylene group having 6 to 20 carbon atoms, and "*" means a bonding point,

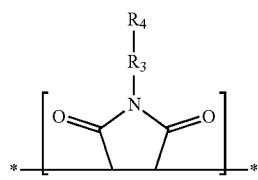

[Chemical Formula 4]

in Chemical Formula 4,

R3 is a direct bond, an alkylene group having 1 to 20 carbon atoms, an alkenyl group having 1 to 20 carbon atoms, or an arylene group having 6 to 20 carbon atoms, R4 is —H, —OH, —NR5R6, a halogen, or an alkyl group having 1 to 20 carbon atoms, R5 and R6 are each independently be hydrogen, an alkyl group having 1 to 20 carbon atoms, or an aryl group having 6 to 20 carbon atoms, and "*" means a bonding point.

9. The method for manufacturing an insulating layer according to claim 8,
wherein the alkali-soluble resin is produced by reaction of a polymer containing a repeating unit represented by the following Chemical Formula 5, an amine represented by the following Chemical Formula 6, and an amine represented by the following Chemical Formula 7:

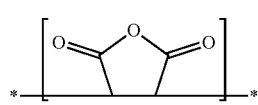

[Chemical Formula 5]

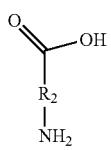

[Chemical Formula 6]

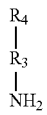

[Chemical Formula 7]

in Chemical Formulas 5 to 7,
R2 to R4 are as defined in claim 8, and
"*" means a bonding point.

10. The method for manufacturing an insulating layer according to claim 8, wherein the alkali-soluble resin is produced by reaction of a compound represented by the following Chemical Formula 8 and a compound represented by the following Chemical Formula 9:

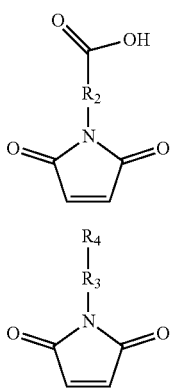

[Chemical Formula 8]

[Chemical Formula 9]

in Chemical Formulas 8 and 9,
R2 to R4 are as defined in claim 9.

11. The method for manufacturing an insulating layer according to claim 1,
wherein the alkali-soluble resin has an acid value of 50 mgKOH/g to 250 mgKOH/g, as determined by KOH titration.

12. The method for manufacturing an insulating layer according to claim 1,
wherein the polymer resin layer contains 1 parts by weight to 150 parts by weight of a heat-curable binder with respect to 100 parts by weight of the alkali-soluble resin.

13. The method for manufacturing an insulating layer according to claim 1,
wherein the heat-curable binder includes at least one functional group selected from the group consisting of an oxetanyl group, a cyclic ether group, a cyclic thioether group, a cyanide group, a maleimide group, a benzoxazine group, and an epoxy group.

14. The method for manufacturing an insulating layer according to claim 1,
wherein the curing is performed at a temperature of 50° C. to 150° C. for 0.1 hours to 2 hours.

15. The method for manufacturing an insulating layer according to claim 1,
further comprising removing the photosensitive resin block after curing the polymer resin block.

16. The method for manufacturing an insulating layer according to claim 15, further comprising a step of curing the polymer resin block at a temperature of 150° C. to 250° C. for 0.1 hours to 10 hours, after the step of removing the photosensitive resin block.

17. The method for manufacturing an insulating layer according to claim 1,
wherein the step of sealing includes:
a step of forming at least two or more semiconductor elements on an adhesive film;
a step of forming the polymer resin layer on the substrate;
a step of contacting the adhesive film with the polymer resin layer; and
a step of peeling the adhesive film and forming the photosensitive resin layer.

* * * * *